(12) United States Patent  
Do

(10) Patent No.: US 7,279,934 B2
(45) Date of Patent: Oct. 9, 2007

(54) APPARATUS FOR DELIVERING INPUTTED SIGNAL DATA

(75) Inventor: Chang-Ho Do, Ichon-shi (KR)

(73) Assignee: Hynix Semiconductor, Inc. (KR)

( * ) Notice: Subject to any disclaimer, the term of this patent is extended or adjusted under 35 U.S.C. 154(b) by 117 days.

(21) Appl. No.: 11/017,672

(22) Filed: Dec. 22, 2004

(65) Prior Publication Data
US 2006/0022706 A1 Feb. 2, 2006

(30) Foreign Application Priority Data
Jul. 27, 2004 (KR) ...................... 10-2004-0058824

(51) Int. Cl.
*H03K 19/094* (2006.01)
*H03F 3/45* (2006.01)

(52) U.S. Cl. .............................. 326/83; 326/86; 327/53

(58) Field of Classification Search .................. 326/68, 326/82–83, 86–87; 327/50, 52–53, 77–78, 327/89
See application file for complete search history.

(56) References Cited
U.S. PATENT DOCUMENTS
5,355,035 A * 10/1994 Vora et al. .................. 327/433

| | | | |
|---|---|---|---|
| 5,977,796 A * | 11/1999 | Gabara ......................... | 326/86 |
| 6,407,588 B1 | 6/2002 | Baker | |
| 6,600,343 B2 | 7/2003 | Baker | |
| 6,654,462 B1 | 11/2003 | Hedberg | |
| 6,943,585 B2 * | 9/2005 | Lee et al. ...................... | 326/58 |
| 7,042,245 B2 * | 5/2006 | Hidaka ......................... | 326/34 |
| 7,061,273 B2 * | 6/2006 | Wang et al. .................. | 326/86 |

FOREIGN PATENT DOCUMENTS
KR 10-2004-0041330 A 5/2004

* cited by examiner

*Primary Examiner*—Rexford Barnie
*Assistant Examiner*—Jason Crawford
(74) *Attorney, Agent, or Firm*—McDermott Will & Emery LLP

(57) ABSTRACT

An apparatus for receiving an inputted signal in order to transmit the inputted signal from an external circuit to an internal circuit includes a comparing block, enabled by an enable signal, for outputting a logic value to the internal circuit in response to a voltage difference between the inputted signal and a reference voltage; a biasing block for biasing the comparing block in order to sink a current from the comparing block to a ground; and a bias control block for receiving a fixed control signal and outputting the fixed control signal in response to the enable signal.

9 Claims, 4 Drawing Sheets

APPARATUS FOR DELIVERING INPUTTED SIGNAL DATA

FIELD OF INVENTION

The present invention relates to a semiconductor device; and, more particularly, to a receiver for receiving an inputted signal from an external circuit by changing a voltage level of an inputted signal according to a predetermined voltage level which is appropriate to an internal circuit.

DESCRIPTION OF PRIOR ART

In a semiconductor device used for processing a digital data or signal, a receiver for detecting a logic value of an inputted digital data or signal is necessary because there is a difference between reference voltages of an internal circuit and an external circuit. Herein, the reference voltage is used for determining which the digital data or signal is a logic low level or a logic high level.

For example, a receiver included in a semiconductor memory device receives a reference voltage from an external circuit. Then, if a voltage level of an inputted signal is higher than that of the reference voltage, the receiver considers the inputted signal as a logic high level and outputs a logic high level signal to an internal circuit. Otherwise, the receiver considers the inputted signal as a logic low level.

FIG. 1 is a schematic diagram showing a conventional receiver used for a semiconductor device.

As shown, the conventional receiver includes a differential amplifying block 100 and a biasing block 120. The differential amplifying block 100 is for receiving a reference voltage VREF and an inputted signal IN and generating an output signal OUT according to a comparison result between the reference voltage VREF and the inputted signal IN. The biasing block 120 is used for biasing the differential amplifying block 100.

The differential amplifying block 100 includes a differential amplifier that receives the reference voltage VREF and the inputted signal IN. Herein, if a level of the reference voltage VREF is higher than a level of the inputted signal IN, the differential amplifier outputs the output signal OUT being a logic high level; and, otherwise, the differential amplifier outputs the output signal OUT being a logic low level.

However, referring to FIG. 1, if a bias voltage V_bias and the reference voltage VREF are continuously inputted to the conventional receiver, a current flow between a supply voltage VDD and a ground VSS is occurred through one side of the differential amplifier although any signal is not inputted as the inputted signal IN. Also, if a meaningless signal such as a noise can be turned on a MOS transistor included in the differential amplifying block 100 instead of the inputted signal IN, a current flow between the supply voltage VDD and the ground VSS is occurred through the other side of the differential amplifier. Therefore, the conventional receiver shown in FIG. 1 can increase a power or current consumption.

FIG. 2 is a schematic diagram showing another conventional receiver used for a semiconductor device.

As shown, the conventional receiver includes a differential amplifying block 200 and a biasing block 220. The differential amplifying block 200 enabled by an enable signal Enable is for receiving a reference voltage VREF and an inputted signal IN and generating an output signal OUT according to a comparison result between the reference voltage VREF and the inputted signal IN. The biasing block 220 receives an inverse enable signal /Enable to bias the differential amplifying block 200.

Herein, the differential amplifying block 200 includes a differential amplifier having two more MOS transistors enabled by the enable signal Enable. If any signal is not inputted to the differential amplifying block 200, the inverse enable signal /Enable being a logic high level is inputted to these two MOS transistor of the differential amplifying block 200 and the inverse enable signal /Enable being a logic low level is inputted to the biasing block 220. Then, the differential amplifying block 100 is inactivated by the enable signal Enable and the inverse enable signal /Enable.

However, the enable signal Enable inputted to the conventional receiver has a voltage level between the supply voltage VDD and the ground VSS. Thus, if the supply voltage is very low or fluctuated, the biasing block 220 cannot be stably operated. That is, an output signal OUT of the conventional receiver shown in FIG. 2 cannot be stably guaranteed because a current flow, i.e., a current sink, through the biasing block 220 does not be normal in response to a fluctuated enable signal.

In a DRAM operation, the supply voltage can be fluctuated at any time. Particularly, if the receiver outputs an unstable output signal whenever the supply voltage is fluctuated, a reliability of a synchronous dynamic random access memory SDRAM operated in synchronization with a clock signal is dramatically decreased because a setup and hold time of the unstable output signal is not guaranteed.

SUMMARY OF INVENTION

It is, therefore, an object of the present invention to provide a receiver for stably delivering and outputting an inputted signal or data under a fluctuation of a voltage level of an enable signal used for activating the receiver.

It is, therefore, another object of the present invention to provide a receiver for reducing a current consumption by being inactivated in an idle state, i.e., when any signal or data is not inputted.

In accordance with an aspect of the present invention, there is provided an apparatus for receiving an inputted signal in order to transmit the inputted signal from an external circuit to an internal circuit including a comparing block, enabled by an enable signal, for outputting a logic value to the internal circuit in response to a voltage difference between the inputted signal and a reference voltage; a biasing block for biasing the comparing block in order to sink a current from the comparing block to a ground; and a bias control block for receiving a fixed control signal and outputting the fixed control signal in response to the enable signal.

BRIEF DESCRIPTION OF DRAWINGS

The above and other objects and features of the present invention will become apparent from the following description of preferred embodiments taken in conjunction with the accompanying drawings, in which.

DETAILED DESCRIPTION OF THE INVENTION

Hereinafter, a semiconductor device having a receiver for stably delivering and outputting an inputted signal or data under a fluctuation of a voltage level of an enable signal according to the present invention will be described in detail referring to the accompanying drawings.

Figure 1A:
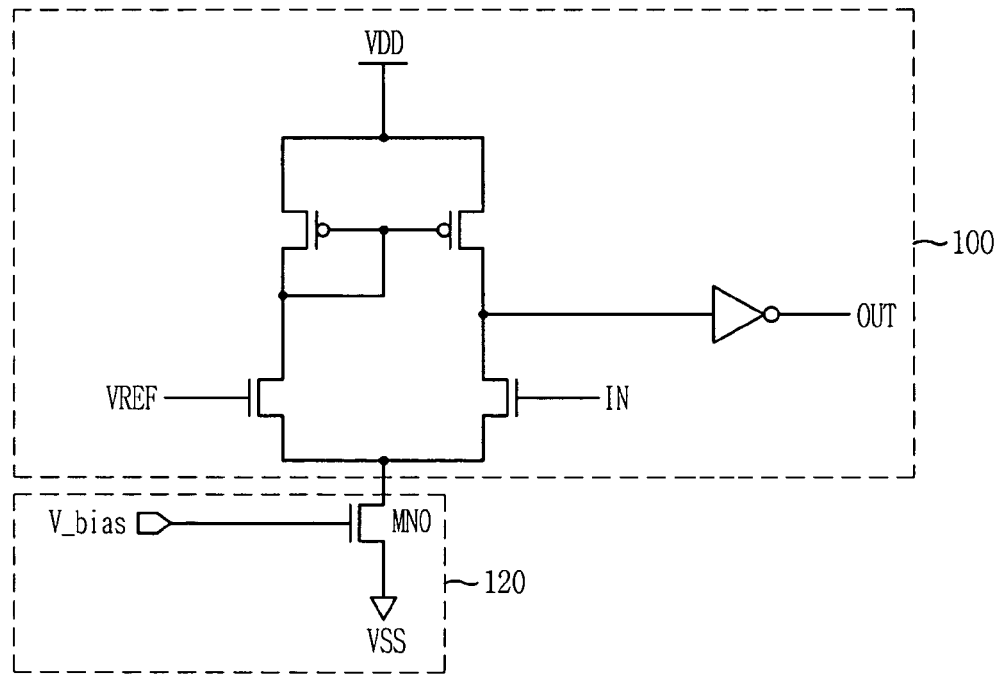
FIG. 1 is a schematic diagram showing a conventional receiver used for a semiconductor device.
Figure 2:
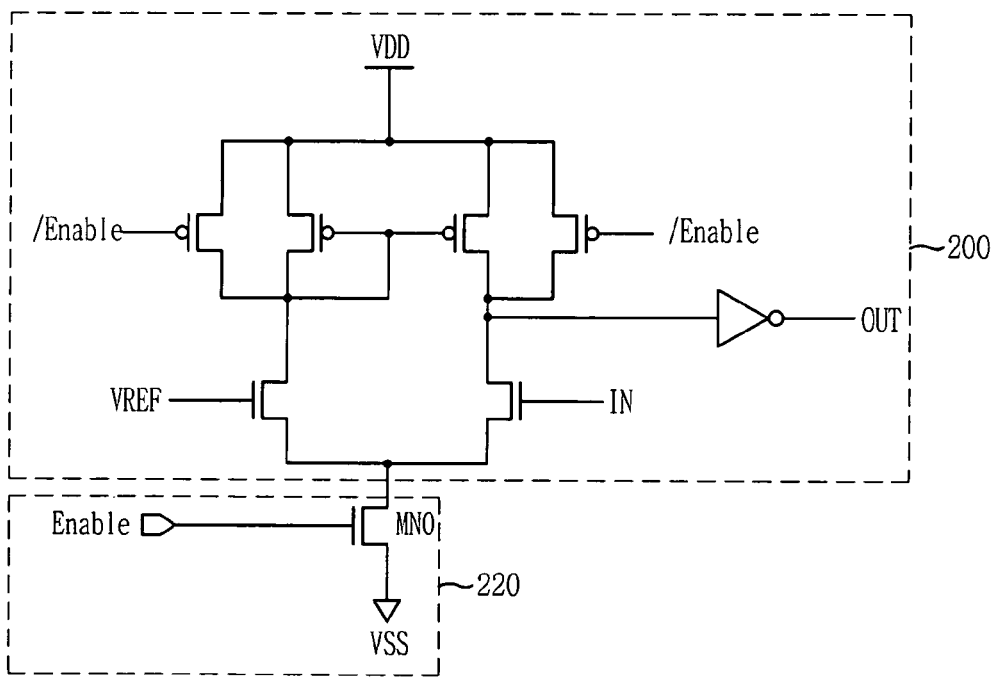
FIG. 2 is a schematic diagram showing another conventional receiver used for a semiconductor device.
Figure 3:
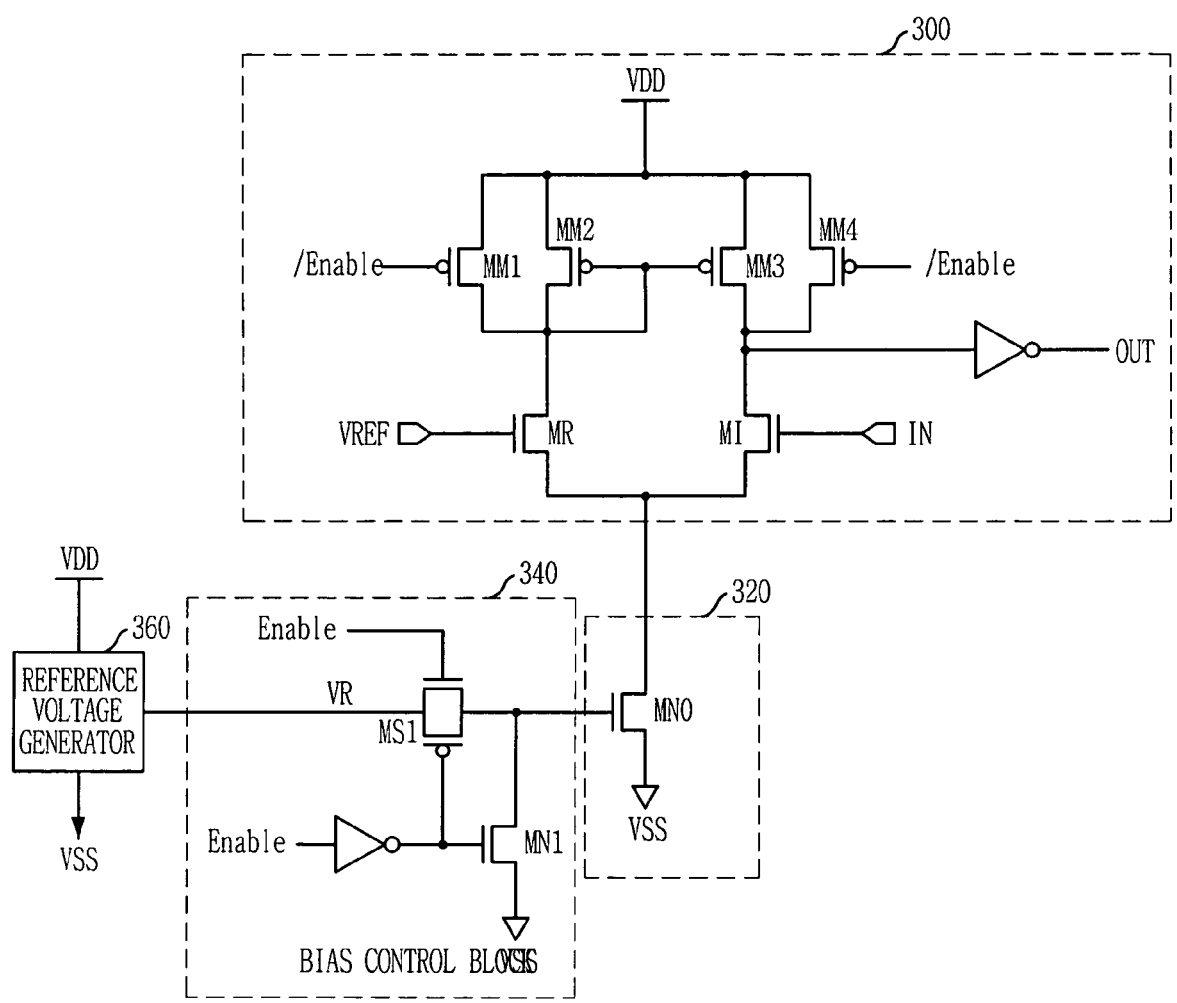
FIG. 3 is a block diagram showing a receiver used for a semiconductor device in accordance with a first embodiment of the present invention.

FIG. 3 is a block diagram showing a receiver used for a semiconductor device in accordance with a first embodiment of the present invention.

As shown, the receiver includes a comparing block 300, a biasing block 320 and a bias control block 340. The receiver receives an inputted signal IN and converts the inputted signal IN into an outputted signal OUT adapted to a voltage level of an internal circuit. Then, the receiver outputs the outputted signal OUT to the internal circuit.

In detail, the comparing block 300 which is enabled by an enable signal Enable compares the inputted signal IN with a reference voltage VREF for outputting the outputted signal OUT to the internal circuit in response to a voltage difference between the inputted signal IN and the reference voltage VREF. Herein, a logic value of the outputted signal OUT is correctly matched with that of the inputted signal IN. The biasing block 320 is for biasing the comparing block 300 in order to sink a current from the comparing block 300 to a ground VSS. The bias control block 340 receives a first fixed control signal VR and transmits the first fixed control signal VR in response to the enable signal Enable.

Herein, the comparing block 300 includes a differential amplifier for receiving the inputted signal IN at one side and the reference voltage VREF at the other side to amplify the voltage difference between the inputted signal IN and the reference voltage VREF. Herein, the differential amplifier is constituted with four MOS transistors MM2, MM3, MR and MI. In addition, the comparing block 300 further includes two MOS transistors. That is, the first MOS transistor MM4 is for activating one side of the differential amplifier in response to the enable signal Enable; and the second MOS transistor MM1 is for activating the other side of the differential amplifier in response to the enable signal Enable.

The biasing block 320 includes a first MOS transistor coupled between the comparing block 300 and the ground VSS for sinking a current flowed through the comparing block 300 in response to the first fixed control signal VR.

Lastly, the bias control block 340 includes a first inverter, a first transmission gate and a fourth. MOS transistor. The first inverter inverts the enable signal Enable and outputs an inverse enable signal to the first transmission gate and the fourth MOS transistor. Then, the first transmission gate transmits the first fixed control signal VR in response to the enable signal Enable. The fourth MOS transistor coupled to the ground VSS turns off the first MOS transistor of the biasing block when the enable signal Enable is inactivated, i.e., a logic low level. Herein, the first transmission gate is constituted with a pair of a PMOS transistor and a NMOS transistor.

Furthermore, the receiver includes a reference voltage generator 360 for generating the first fixed control signal VR having a fixed voltage level between a supply voltage VDD and the ground VSS. Thus, the first fixed control signal VR has a stable predetermined voltage level under a fluctuation of a voltage level of the enable signal Enable. Then, under the fluctuation of a voltage level of the enable signal Enable, the receiver can be stably operated because a stable current flow through the comparing block 300 is guaranteed.

Figure 4:
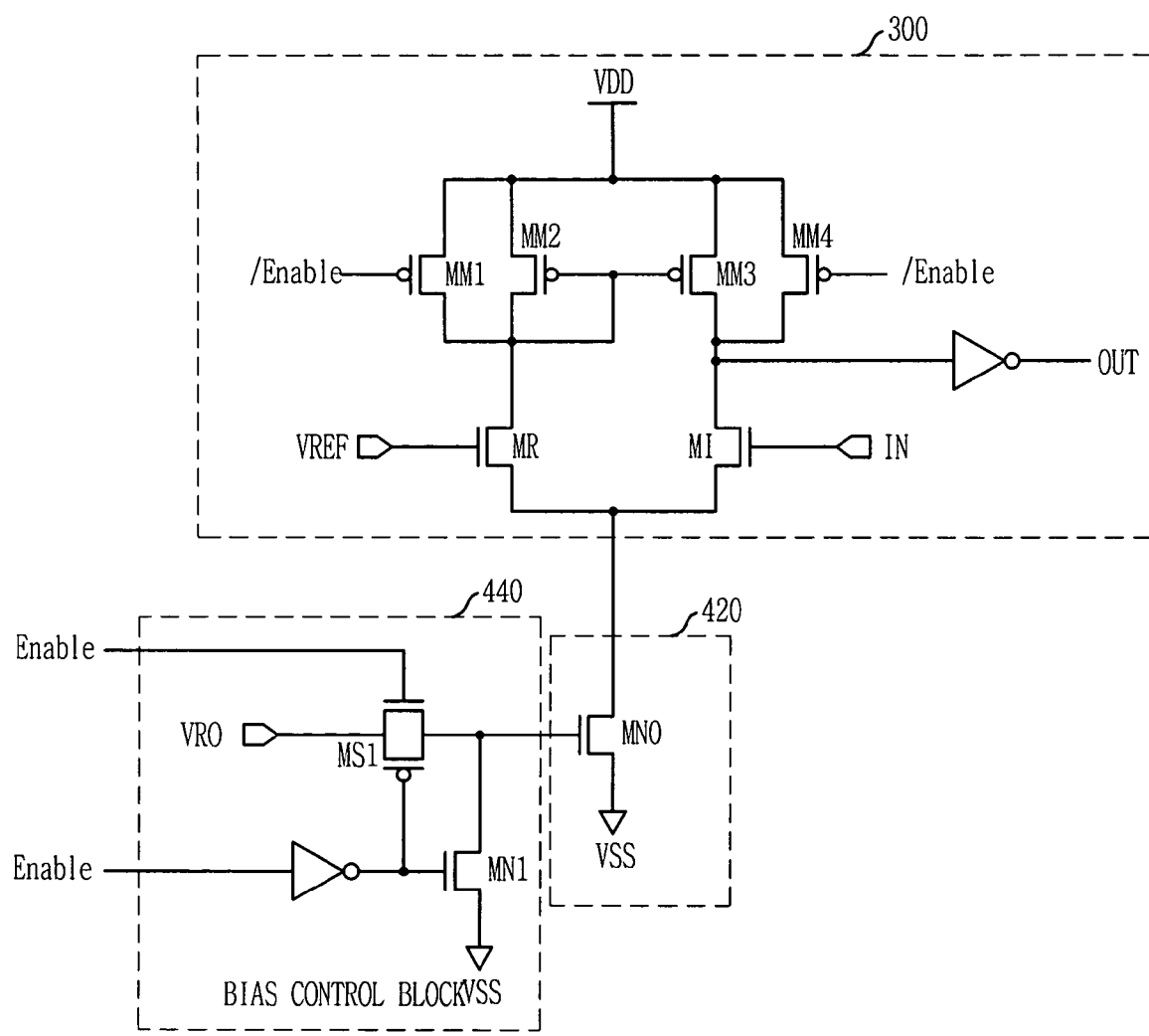
FIG. 4 is a block diagram depicting a receiver used for a semiconductor device in accordance with a second embodiment of the present invention.

FIG. 4 is a block diagram depicting a receiver used for a semiconductor device in accordance with a second embodiment of the present invention.

As shown, the receiver is very similar to the receiver described in FIG. 3 in their structures. That is, the receiver includes the comparing block 300, the biasing block 320 and a bias control block 440. Referring to FIG. 3, the bias control block 440 is the same to the bias control block 340. However, there is not any reference voltage generator, e.g., 360 shown in FIG. 3, for generating a second fixed control signal VR0.

Herein, the second fixed control signal VR0 is inputted from the external circuit. Also, the reference voltage VREF can be inputted to the bias control block 440 as the second fixed control signal VR0.

Figure 5:
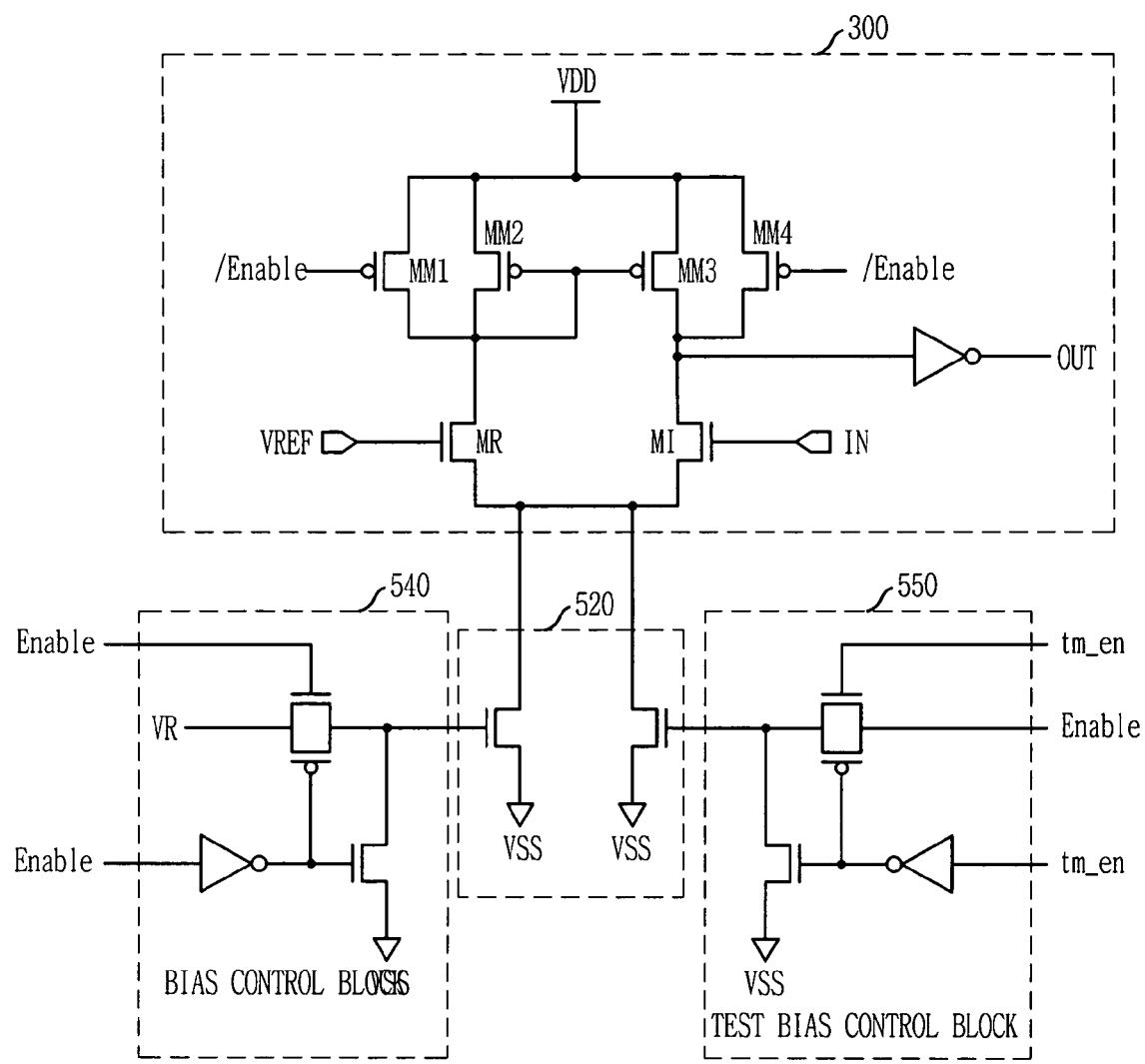
FIG. 5 is a block diagram describing a receiver used for a semiconductor device in accordance with a third embodiment of the present invention.

FIG. 5 is a block diagram describing a receiver used for a semiconductor device in accordance with a third embodiment of the present invention.

As shown, the receiver includes the comparing block 300, a biasing block 520, a bias control block 540 and a test bias control block 550. During both a normal operation mode and a test mode of a semiconductor device, the receiver can receive an inputted signal IN and convert the inputted signal IN into an outputted signal OUT adapted to a voltage level of an internal circuit. Then, the receiver outputs the outputted signal OUT to the internal circuit.

Herein, because the comparing block 300 is same to the comparing block described in FIG. 3, a detailed description about an operation of the comparing block 300 is omitted.

Referring to FIG. 5, the biasing block is constituted with two MOS transistors, i.e., fifth and sixth MOS transistors. The fifth MOS transistor coupled between the comparing block 300 and the ground VSS is for sinking a current flowed through the comparing block 300 in response to a third fixed control signal VR. That is, the fifth MOS transistor is used during the normal operation mode of a semiconductor device such as a DRAM. Also, the sixth MOS transistor coupled between the comparing block 300 and the ground VSS is for sinking a current flowed through the comparing block in response to the enable signal Enable during the test mode. Herein, the fifth MOS transistor of the bias block 520 is controlled by the bias control block 540; and the sixth MOS transistor of the bias block 520 is controlled by the test bias control block 550.

The bias control block 540 is same to the bias control blocks described in FIGS. 3 and 4. Herein, the third fixed control signal VR can be inputted from the external circuit or be generated from the reference voltage generator 360 shown in FIG. 3. Also, the reference voltage VREF can be inputted to the bias control block 540 as the third fixed control signal VR.

Furthermore, the receiver includes the test bias control block 550 for controlling the biasing block 520 in the test mode. Like the bias control block 540, the test bias control block 550 includes a second inverter, a second transmission and a seventh MOS transistor.

The second inverter inverts a test enable signal tm_en. Herein, the test enable signal tm_en is inputted for activating the comparing block 300 in the test mode of the semiconductor device. The second transmission gate transmits the enable signal Enable in response to the test enable signal tm_en. The seventh MOS transistor is for supplying the ground in order to turn off the fourth MOS transistor of the biasing block when the test enable signal tm_en is inactivated.

That is, in the test mode, the enable signal Enable used for activating the comparing block 300 is also inputted to the biasing block 520 through the test bias control block 550. Thus, the comparing block 300 and the bias block 530 are simultaneously activated or inactivated in response to the enable signal Enable.

As above described, the receiver according to the present invention can be generally used for a semiconductor memory device which receives a digital data or a digital signal from an external circuit. Particularly, the receiver according to the present invention can be applied to a data, command or address input circuit in a semiconductor memory device.

An apparatus for detecting an inputted signal and stably transmitting the inputted signal according to the present invention can reduce a current consumption in an idle state because the receiver is inactivated when any signal or data is not inputted.

Also, although an enable signal inputted to the receiver for activating the receiver is unstably fluctuated, a stable current flow of the receiver is guaranteed; and, then, an inputted signal or inputted data can be correctly and accurately delivered into an internal circuit through the receiver.

The present application contains subject matter related to Korean patent application No. 2004-58824, filed in the Korean Patent Office on Jul. 27, 2004, the entire contents of which being incorporated herein by reference.

While the present invention has been described with respect to the particular embodiments, it will be apparent to those skilled in the art that various changes and modification may be made without departing from the spirit and scope of the invention as defined in the following claims.

What is claimed is:

1. An apparatus for receiving an inputted signal in order to transmit the inputted signal from an external circuit to an internal circuit, comprising:
    a comparing block, enabled by an enable signal, for comparing an inputted signal with a reference voltage to output a logic value corresponding to a logic level of the inputted signal to the internal circuit;
    a biasing block for biasing the comparing block in order to sink a current from the comparing block to a ground;
    a fixed voltage source, which produces a fixed voltage level between a supply and a ground, and
    a bias control block for receiving the fixed voltage from the fixed voltage source and outputting the fixed voltage in response to the enable signal.

2. The apparatus as recited in claim 1, wherein the comparing block includes a differential amplifier for receiving the inputted signal at one side and the reference voltage at the other side to amplify the voltage difference between the inputted signal and the reference voltage.

3. The apparatus as recited in claim 2, wherein the comparing block further includes:
    a first MOS transistor for activating one side of the differential amplifier in response to the enable signal; and
    a second MOS transistor for activating the other side of the differential amplifier in response to the enable signal.

4. The apparatus as recited in claim 1, wherein the biasing block includes a first MOS transistor coupled between the comparing block and the ground for sinking a current flowed through the comparing block in response to the fixed voltage output by the bias control block.

5. The apparatus as recited in claim 4, wherein the bias control block includes:
    a first inverter for inverting the enable signal;
    a first transmission gate for transmitting the fixed voltage in response to the enable signal; and
    a second MOS transistor for supplying the ground in order to turn off the first MOS transistor of the biasing block when the enable signal is inactivated.

6. The apparatus as recited in claim 1, further comprising a test bias control block for controlling the biasing block in a test mode.

7. The apparatus as recited in claim 6, wherein the biasing block includes:
    a first MOS transistor coupled between the comparing block and the ground for sinking a current flowed through the comparing block in response to the fixed voltage output by the bias control block; and
    a second MOS transistor coupled between the comparing block and the ground for sinking a current flowed through the comparing block in response to the enable signal during the test mode.

8. The apparatus as recited in claim 7, wherein the bias control block includes:
    a first inverter for inverting the enable signal;
    a first transmission gate for transmitting the fixed voltage in response to the enable signal; and
    a third MOS transistor for supplying the ground in order to turn off the first MOS transistor of the biasing block when the enable signal is inactivated.

9. The apparatus as recited in claim 8, wherein the test bias control block includes:
    a second inverter for inverting a test enable signal;
    a second transmission gate for transmitting the enable signal in response to the test enable signal; and
    a fourth MOS transistor for supplying the ground in order to turn off the second MOS transistor of the biasing block when the test enable signal is inactivated.

* * * * *